United States Patent
Gandolfi et al.

(10) Patent No.: US 6,483,449 B2
(45) Date of Patent: Nov. 19, 2002

(54) DIGITAL-ANALOG CONVERTER COMPRISING A THIRD ORDER SIGMA DELTA MODULATOR

(75) Inventors: Gabriele Gandolfi, Siziano (IT); Andrea Baschirotto, Tortona (IT); Vittorio Colonna, Landriano (IT); Paolo Cusinato, Sestri Levante (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/904,442

(22) Filed: Jul. 11, 2001

(65) Prior Publication Data

US 2002/0041244 A1 Apr. 11, 2002

(30) Foreign Application Priority Data

Jul. 11, 2000 (EP) .............................................. 00830485

(51) Int. Cl.[7] ................................................. H03M 3/00
(52) U.S. Cl. ........................ 341/143; 341/118; 341/120; 341/200; 341/172
(58) Field of Search ................................ 341/143, 118, 341/120, 200, 172, 150

(56) References Cited

U.S. PATENT DOCUMENTS 5,072,219 A    12/1991    Boutaud et al. ............. 341/150
5,477,481 A    12/1995    Kerth .......................... 364/825
5,648,799 A *  7/1997    Cabler ......................... 341/143

FOREIGN PATENT DOCUMENTS

WO            97/06601           2/1997

* cited by examiner

Primary Examiner—Michael Tokar
Assistant Examiner—Linh Van Nguyen
(74) Attorney, Agent, or Firm—Lisa K. Jorgenson; E. Russell Tarleton; SEED IP Law Group PLLC

(57) ABSTRACT

A digital-analog converter having a sigma delta cascade modulator with two outputs, particularly a third order sigma delta modulator 2+1. The digital-analog converter includes a sigma delta modulator of the type having two outputs able to supply a first and a second signal to the two outputs; a reconstruction circuit of the first and second signals able to provide a reconstructed signal; a filter able to filter the reconstructed signal; the reconstruction circuit combining the first and second signals according to the following relationship:

$$Yout\ Y1*(1+Z^{-1})-Y2*(1-Z^{-1})+Y2*Z^{-2}*(1-Z^{-1}),$$

where:

Yout corresponds to said reconstructed signal, Y1 corresponds to said first signal, Y2 corresponds to said according to signal, Z corresponds to the Z transform.

13 Claims, 2 Drawing Sheets

DIGITAL-ANALOG CONVERTER COMPRISING A THIRD ORDER SIGMA DELTA MODULATOR

BACKGROUND OF THE INVENTION

1. Field of the Invention

The present invention pertains to a digital-analog converter having a sigma delta cascade modulator with two outputs, and more particularly to a third order sigma delta 2+1 modulator.

2. Description of the Related Art

The two output signals of a third order sigma delta modulator must be combined by means of an appropriate reconstruction transfer function to get a correct output signal.

A digital-analog converter has a sigma delta modulator with two outputs that are connected to a reconstruction circuit and then to a leveling filter. The reconstruction circuit transfer function depends on the modulator topology. In the case of a sigma delta modulator of the type 2+1, the reconstruction transfer function is the following:

$$\text{Yout}=Y1-(1-Z-1)2*Y2 \quad (1)$$

where Yout is the combined signal, Y1 is the signal present at a first output, Y2 is the signal present at a second output, and Z corresponds to the Z transform.

The transfer function should be realized at a low cost, and it should not influence the system performance in terms of signal-to-noise ratio and distortion.

A reconstruction circuit is effectuated by means of digital circuits. The signal after the reconstruction has a resolution of a thermometric code with 6 bits, so that a digital-analog converter is necessary to send the signal to the leveling filter that normally is analogical. The resolution of this digital-analog converter is equal to that of the whole structure. Therefore, linearisation techniques are necessary to reach the requested distortion performances.

Another reconstruction circuit is realized by means of analogical circuits. This system is based on the fact that a leveling filter is constituted by a cascade of integrators. In fact, if the signal is applied to the input of an integrator inside the cascade, its equivalent transfer function is composed by N derivatives in cascade where N is the number of integrators between the filter main input and this additional input. Since the reconstruction function generally uses only derivatives and multiplier factors to adapt the filter coefficients, by opportunely choosing the additional input point it is possible to realize the desired transfer function. In the case of the use of the transfer function above, the signal Y1 is applied to the filter main input, the signal Y2 to the third integrator input, and the opportune multiplier factors are chosen to get the desired gain. The disadvantages are in the fact that in order to reach the desired reconstruction function structure, limitations are necessary, and the performances depend on the capacitor tolerances and on the parameters of the operational amplifiers used as integrators, like the finished gain values, the speed and the rise time.

SUMMARY OF THE INVENTION

The disclosed embodiments of the present invention are directed to a digital-analog converter having a sigma delta modulator of the type with two outputs and a reconstruction circuit that does not require a digital-analog converter, is insensitive to the operational amplifier parameters, and does not impose limits in the choice of the leveling filter.

In accordance with the present invention, the foregoing and other objects are attained by means of a digital-analog converter having a sigma delta modulator of the type with two outputs able to provide a first and a second signal at said two outputs; a reconstruction circuit of said first and second signals able to provide a reconstructed signal; a filter able to filter said reconstructed signal; the reconstruction circuit configured to combine said first and second signals according to the following relationship:

$$\text{Yout}=Y1*(1+Z^{-1})-Y2*(1Z^{-1})+Y2*Z^{-2}*(1-Z^{-1}),$$

where:

Yout corresponds to said reconstructed signal,
Y1 corresponds to said first signal,
Y2 corresponds to said second signal,
Z corresponds to the Z transform.

In accordance with another embodiment of the invention, a digital-analog converter is provided that includes a sigma delta modulator of the type having a first and a second output able to provide a first and a second output signal; an operational amplifier having a positive input and a negative input, said negative input is connected to a first node; a first switch connected between said first node and a second node; a second switch connected between said first node and a third node; a third switch connected between said first node and a fourth node; a fourth switch connected between said second node and a first prefixed bias voltage; a fifth switch connected between said third node and a second prefixed bias voltage; a sixth switch connected between said fourth node and a third prefixed bias voltage; a first capacitor connected between said second node and a fifth node; a second capacitor connected between said third node and a sixth node; a third capacitor connected between said fourth node and a seventh node; a seventh switch connected between said fifth node and a first input; an eighth switch connected between said sixth node and a second input; a ninth switch connected between said seventh node and a third input; a tenth switch connected between said fifth node and a fourth input; an eleventh switch connected between said sixth node and a fifth input; a twelfth switch connected between said seventh node and a sixth input; said first input is applied to said first output; said second input is applied to said first inverted output; said third and said fourth input are applied to said second delayed twice and inverted output; said fifth and said sixth input are applied to said second output.

Because of the present invention, it is possible to realize a low cost analogical type reconstruction circuit, simple and with good performance in terms of signal-to-noise ratio and distortion.

BRIEF DESCRIPTION OF THE DRAWINGS

The characteristics and the advantages of the present invention will be evident from the following detailed description of one embodiment, illustrated as not a limitative example, in the accompanying drawings, in which.

DETAILED DESCRIPTION OF THE INVENTION

Figure 1:
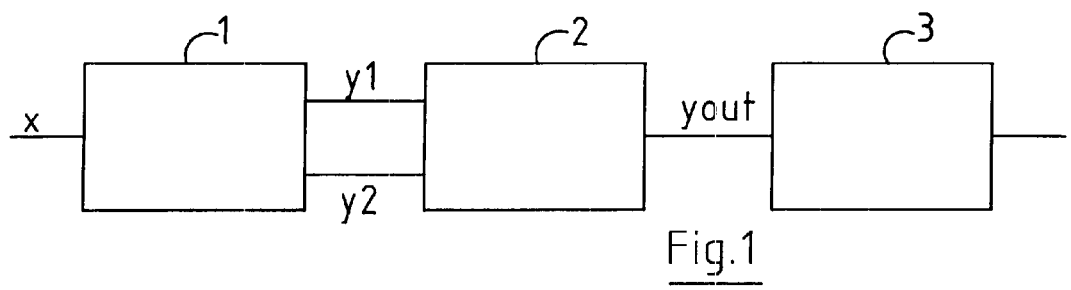
FIG. 1 shows a digital-analog converter comprising a sigma delta modulator of the type having two outputs.

FIG. 1 shows a sigma delta modulator 1 having an input signal X and two output signals Y1 and Y2. The signals Y1 and Y2 are supplied to a reconstructed circuit 2 which provides a reconstructed signal Yout on its output obtained by the combination of the Y1 and Y2 signals. The reconstructed signal is then applied to a leveling filter 3.

Figure 2:
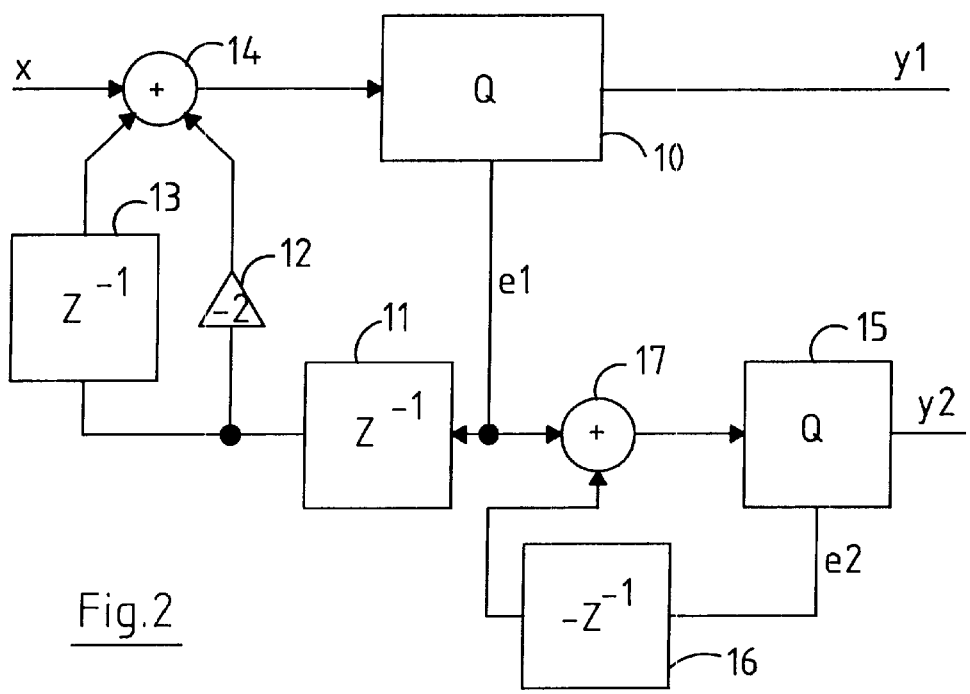
FIG. 2 shows a third order sigma delta modulator of the type 2+1.

In FIG. 2 a sigma delta modulator of the third order of the type 2+1 is shown. It has an input signal X and two output signals Y1 and Y2. It comprises a second order modulator based on the quantizer 10, which produces the output signal Y1, and a first order modulator based on the quantizer 15 which produces the output signal Y2.

The input signal X is applied to an adder 14 to which the signals are applied as inputs that are in output from a delay circuit 13 and from a circuit 12 that effects the multiplication of the signal present at its input by a multiplier factor equal to −2. The output signal of the adder node 14 is applied in input to the quantizer 10 which provides the output signal Y1. The quantizer 10 provides another output signal, that is the signal relative to the quantization error e1 which is applied to the input of a delay circuit 11. The output of the delay circuit 11 is applied to the inputs of the delay circuit 13 and of the circuit 12.

The signal relative to the quantization error e1 is also applied to an adder node 17 to which is also applied as input the signal outputted from a delay circuit 16 which also effects the inversion of the signal sign. The output signal of the adder node 17 is applied to the input of the quantizer 15 which provides the output signal Y2. The quantizer 15 provides another output signal, that is the signal relative to the quantization error e2 which is applied to the input of the delay circuit 16.

According to the present invention the reconstruction transfer function used is the following:

$$\text{Yout} = (Y1 - (1-Z^{-1})^2 * Y2) * (1+Z^{-1}) \tag{2}$$

where Yout is the combined signal, Y1 is the signal present at a modulator output, Y2 is the signal present at the other modulator output and Z corresponds to the Z transform.

In the transfer function (1) a zero $(1+Z^{-1})$ has been inserted at a half of the sampling frequency to reduce the quantization noise at high frequency.

After some simple mathematical calculations the previous transfer function (2) becomes:

$$\text{Yout} = Y1*(1+Z^{-1}) - Y2*(1-Z^{-1}) + Y2* Z^{-2}*(1-Z^{-1}) \tag{3}$$

In this way the transfer function provides the sum of three terms. The signals Y1 and Y2 are signals that can have only two values. For this transfer function implementation delays are implemented by means of flip-flops and sign inversions that can be realized by inverters. In addition, there are circuits that are able to realize the function $(1-Z^{-1})$, like that reported in FIG. 3.

Figure 3:
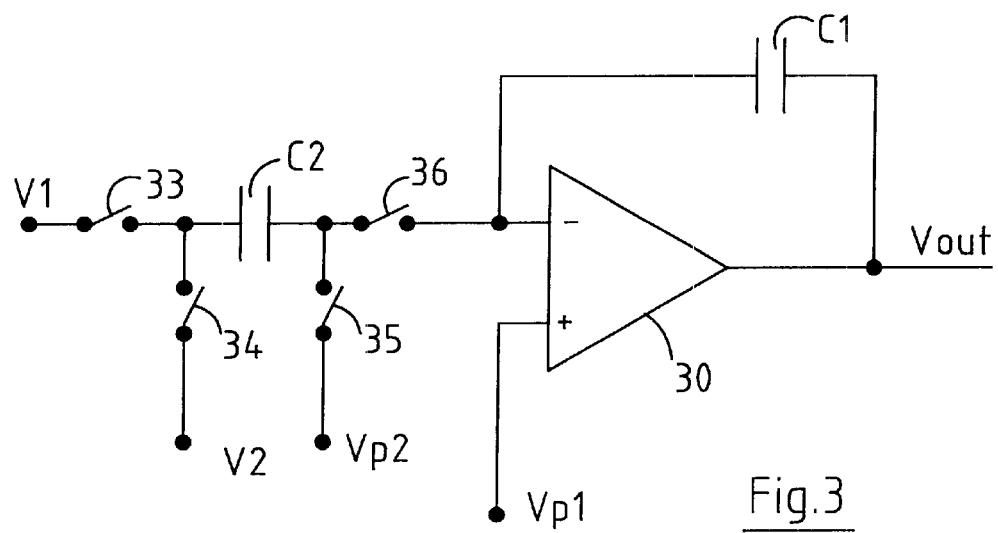
FIG. 3 shows an integrator with switched capacitors.

In FIG. 3 there is shown an operational amplifier 30 that provides an output voltage Vout, which has a capacitor C1 applied between its inverting input and its output. The non-inverting input is connected to a prefixed bias voltage Vp1. At the inverting input a terminal of a switch 36 is also connected, and the other terminal is connected to a terminal of a switch 35 and to a terminal of a capacitor C2. The other terminal of the switch 35 is connected to a prefixed bias voltage Vp2. The other terminal of the capacitor C2 is connected to a terminal of a switch 33 and to a terminal of a switch 34. To the other terminal of the switch 33 the signal V1 is connected. To the other terminal of the switch 34 the signal V2 is connected.

The switches reported in FIG. 3 are controlled switches. More particularly, the switches 33 and 35 are controlled by the same signal having a prefixed frequency; the switches 34 and 36 are controlled by the same signal having a prefixed frequency equal to that used for the switches 33 and 35 but out of phase by one-half period. The switch control frequency is equal to the sampling frequency of the input signal. Sampling is effectuated at the input of the modulator 1.

The transfer function of the circuit reported in FIG. 3 is the following:

$$\text{Vout} = [(C2/C1)*(Z^{-1}* V1 - V2)]/(1-Z^{-1}) \tag{4}$$

Figure 4:
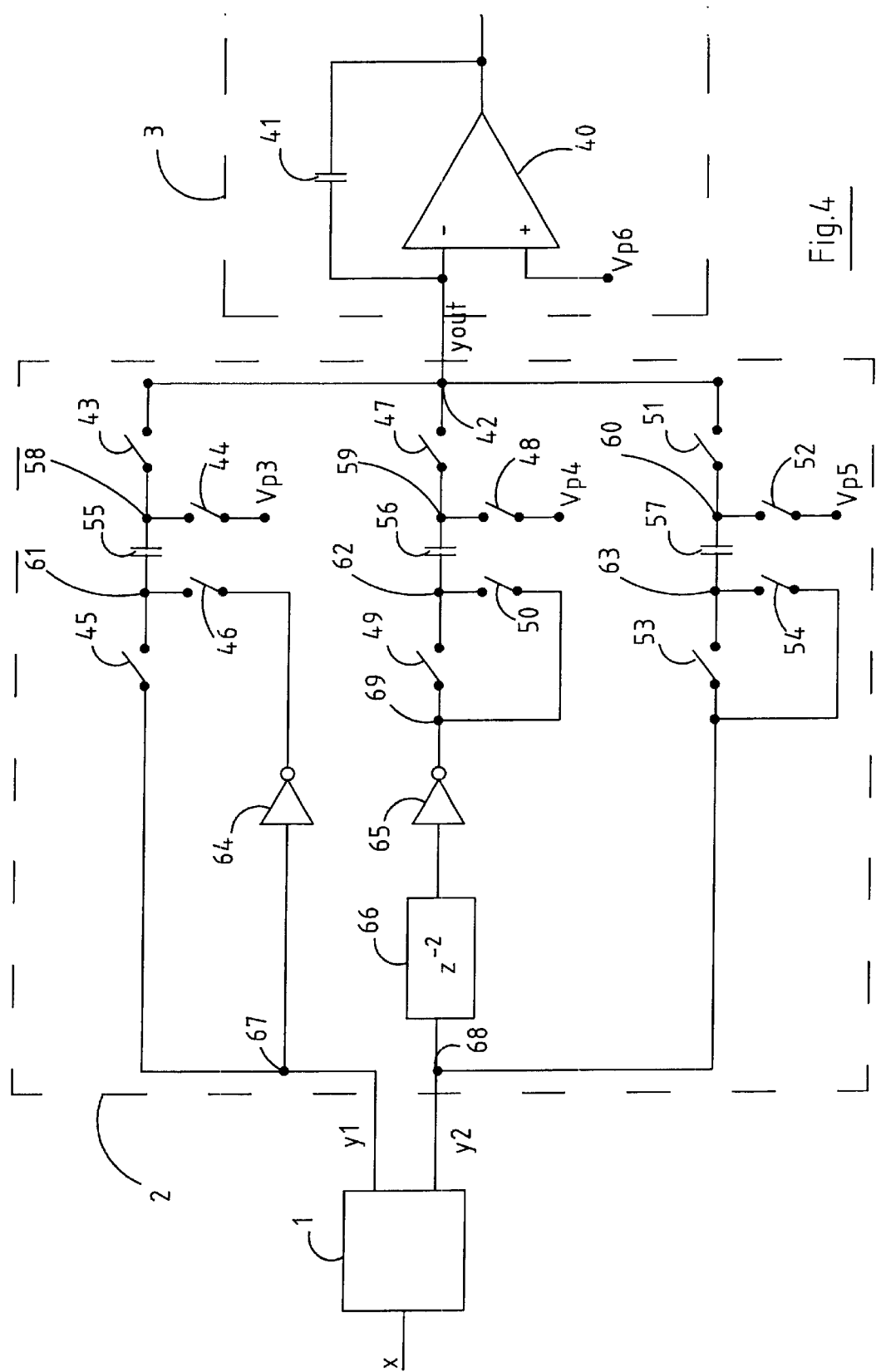
FIG. 4 shows a realization example of a reconstruction circuit of a digital-analog converter in accordance to the present invention.

FIG. 4 shows an embodiment of a reconstruction circuit of a digital-analog converter in accordance with the present invention. It is noted that the input stage of the leveling filter 3 is shown, which comprises an operational amplifier 40 that has a capacitor 41 applied between its inverting input and its output. Its non-inverting input is connected to a prefixed bias voltage Vp6. At the inverting input is also connected the signal Yout coming out from the reconstruction circuit 2 and present on the node 42.

The reconstruction circuit 2 comprises a first branch that includes a switch 43 connected between the node 42 and a node 58, a switch 43 connected between the node 58 and a prefixed bias voltage Vp3, a capacitor 55 connected between the node 58 and a node 61, a switch 45 connected between the node 61 and a node 67 to which the signal Y1 is applied, a switch 46 connected between the node 61 and the output of an inverter 64, the input of which is applied to the node 67.

The reconstruction circuit 2 comprises a second branch that includes a switch 47 connected between the node 42 and a node 59, a switch 48 connected between the node 59 and a prefixed bias voltage Vp4, a capacitor 56 connected between the node 59 and a node 62, a switch 49 connected between the node 62 and a node 69, a switch 50 connected between the node 62 and the node 69. At the node 69 the output of an inverter 65 is applied, the input of which is applied to the output of a double delay circuit 66, the input of which is applied to the node 68 to which the signal Y2 is applied.

The reconstruction circuit 2 comprises a third branch that includes a switch 51 connected between the node 42 and a node 60, a switch 52 connected between the node 60 and a prefixed bias voltage Vp5, a capacitor 57 connected between the node 60 and a node 63, a switch 54 connected between the node 63 and a node 68 to which the signal Y2 is applied, a switch 53 connected between the node 63 and the node 68.

The switches of FIG. 4 are switches controlled by two signals having the same frequency (equal to the sampling frequency of the input signal) but out of phase by one-half period. Particularly, the switches 44, 45, 48, 49, 52 and 53 are controlled by a first signal, and the switches 43, 46, 47, 50, 51 and 54 are controlled by a second signal. The control signals are generated by suitable frequency generators (not shown).

The circuit of FIG. 4 is able to realize the transfer function (3) in an analog fashion. It results being sensitive to the capacitor tolerances but with the normally attainable tolerance value it is possible to reach the requested performances. For instance with a capacitor construction tolerance of 3×1000 it is possible to obtain a signal to noise ratio higher than 100 dB.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A digital-analog converter, comprising:

a sigma delta modulator of the type having a first and a second output able to provide a first and a second output signal;

an operational amplifier having a positive input and a negative input, said negative input is connected to a first node;

a first switch connected between said first node and a second node;

a second switch connected between said first node and a third node;

a third switch connected between said first node and a fourth node;

a fourth switch connected between said second node and a first prefixed bias voltage;

a fifth switch connected between said third node and a second prefixed bias voltage;

a sixth switch connected between said fourth node and a third prefixed bias voltage;

a first capacitor connected between said second node and a fifth node;

a second capacitor connected between said third node and a sixth node;

a third capacitor connected between said fourth node and a seventh node;

a seventh switch connected between said fifth node and a first input;

an eighth switch connected between said sixth node and a second input;

a ninth switch connected between said seventh node and a third input;

a tenth switch connected between said fifth node and a fourth input;

an eleventh switch connected between said sixth node and a fifth input;

a twelfth switch connected between said seventh node and a sixth input;

said first input is applied to said first output;

said second input is applied to said first output inverted;

said third and said fourth input is applied to said second output delayed twice and inverted;

said fifth and said sixth input are applied to said second output.

2. The converter of claim 1, comprising a fourth capacitor connected between said negative input and an output of said operational amplifier.

3. The converter of claim 1 wherein said positive input is connected to a fourth prefixed bias voltage.

4. The converter of claim 1, comprising a first generator of an opening and closing signal of said fourth, fifth, sixth, seventh, ninth and eleventh switches.

5. The converter of claim 1, comprising a second generator of an opening and closing signal of said first, second, third, eighth, tenth and twelfth switches.

6. The converter according to claim 1, wherein the signal present on the first node corresponds to the reconstructed signal of said first and second output signal of said sigma delta modulator.

7. The converter of claim 6, wherein said reconstructed signal is filtrated by a leveling filter and said operational amplifier belongs to said filter.

8. A digital-to-analog converter, comprising:

a sigma delta modulator having a first output and a second output and configured to generate a first output signal and a second output signal on the first and second outputs, respectively;

an operational amplifier having a positive input and a negative input, the negative input coupled to a first node;

a first switch coupled between the first node and a second node;

a second switch coupled between the first node and a third node;

a third switch coupled between the first node and a fourth node;

a fourth switch coupled between the second node and a first prefixed bias voltage;

a fifth switch coupled between the third node and a second prefixed bias voltage;

a sixth switch coupled between the fourth node and a third prefixed bias voltage;

a first capacitor coupled between the second node and a fifth node;

a second capacitor coupled between the third node and a sixth node;

a third capacitor coupled between the fourth node and a seventh node;

a fourth capacitor coupled between the negative input of the operational amplifier and an output of the operational amplifier;

a seventh switch coupled between the fifth node and a first input that is coupled to the first output of the sigma delta modulator;

an eighth switch coupled between the sixth node and a second input that is coupled to the first output inverted;

a ninth switch coupled between the seventh node and a third input that is coupled to the second output of the sigma delta modulator and delayed twice and inverted;

a tenth switch coupled between the fifth node and a fourth input that is coupled to the second output of the sigma delta modulator and delayed twice and inverted;

an eleventh switch coupled between the sixth node and a fifth input that is coupled to the second output of the sigma delta modulator;

a twelfth switch coupled between the seventh node and a sixth input that is coupled to the second output of the sigma delta modulator; and the fourth prefixed bias voltage coupled to the positive input of the operational amplifier.

9. The converter of claim 8, wherein the fourth, fifth, sixth, seventh, ninth, and eleventh switches are controlled by a first generator that generates a first opening and closing signal; and the first, second, eighth, tenth, and twelfth switches are controlled by a second generator that generates a second opening and closing signal.

10. The converter of claim 9, wherein the output of the operational amplifier comprises a reconstructed signal of the first and second output signals of the sigma delta modulator and is coupled to the first node.

11. A digital-to-analog converter, comprising:

a sigma delta modulator having a first output and a second output and configured to generate a first output signal and a second output signal on the first and second outputs, respectively;

an operational amplifier having a positive input and a negative input, the negative input coupled to a first node;

a first switch coupled between the first node and a second node;

a second switch coupled between the first node and a third node;

a third switch coupled between the first node and a fourth node;

a fourth switch coupled between the second node and a first prefixed bias voltage;

a fifth switch coupled between the third node and a second prefixed bias voltage;

a sixth switch coupled between the fourth node and a third prefixed bias voltage;

a first capacitor coupled between the second node and a fifth node;

a second capacitor coupled between the third node and a sixth node;

a third capacitor coupled between the fourth node and a seventh node;

a fourth capacitor coupled between the negative input of the operational amplifier and an output of the operational amplifier;

a seventh switch coupled between the fifth node and a first input that is coupled to the first output of the sigma delta modulator;

an eighth switch coupled between the sixth node and a second input that is coupled to the first output inverted;

a ninth switch coupled between the seventh node and a third input that is coupled to the second output of the sigma delta modulator and delayed twice and inverted;

a tenth switch coupled between the fifth node and a fourth input that is coupled to the second output of the sigma delta modulator and delayed twice and inverted;

an eleventh switch coupled between the sixth node and a fifth input that is coupled to the second output of the sigma delta modulator;

a twelfth switch coupled between the seventh node and a sixth input that is coupled to the second output of the sigma delta modulator; and the fourth prefixed bias voltage coupled to the positive input of the operational amplifier;

a first generator coupled to the fourth, fifth, sixth, seventh, ninth, and eleventh switches and configured to generate a first opening and closing control signal; and a second generator coupled to the first, second, third, eighth, tenth, and twelfth switches and configured to generate a second opening and closing control signal.

12. The converter of claim 11, wherein the first and second generators are configured to generate the first opening and closing control signal and the second opening and closing control signal, respectively, at a same prefixed frequency that is out of phase by one-half period.

13. The converter of claim 12, wherein the prefixed frequency comprises a sampling frequency of a digital input signal received at the sigma delta modulator.

* * * * *